(12) United States Patent  
Beasom

(10) Patent No.: US 7,973,360 B2  
(45) Date of Patent: *Jul. 5, 2011

(54) DEPLETABLE CATHODE LOW CHARGE STORAGE DIODE

(75) Inventor: James Douglas Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/754,923

(22) Filed: Apr. 6, 2010

(65) Prior Publication Data

US 2010/0193895 A1   Aug. 5, 2010

Related U.S. Application Data

(63) Continuation of application No. 12/115,760, filed on May 6, 2008, now Pat. No. 7,759,728, which is a continuation of application No. 11/326,393, filed on Jan. 6, 2006, now Pat. No. 7,385,246.

(60) Provisional application No. 60/701,485, filed on Jul. 22, 2005.

(51) Int. Cl.
  *H01L 29/66* (2006.01)

(52) U.S. Cl. ........ 257/335; 257/327; 257/342; 438/214; 438/280; 438/521

(58) Field of Classification Search .................. 257/327, 257/335, 342, 343; 438/214, 280, 521
See application file for complete search history.

(56) References Cited

U.S. PATENT DOCUMENTS

| 4,823,173 | A | 4/1989 | Beasom |
| 5,264,719 | A | 11/1993 | Beasom |
| 6,046,474 | A | 4/2000 | Oh et al. |
| 6,552,392 | B2 | 4/2003 | Beasom |
| 6,897,103 | B2 | 5/2005 | Beasom |
| 7,161,223 | B2 | 1/2007 | Beasom |
| 7,385,246 | B2 | 6/2008 | Beasom |
| 7,759,728 | B2 * | 7/2010 | Beasom ........................ 257/327 |
| 2005/0230747 | A1 | 10/2005 | Suzuki et al. |
| 2005/0230761 | A1 | 10/2005 | Imahashi et al. |
| 2006/0118860 | A1 | 6/2006 | Hatade |

* cited by examiner

*Primary Examiner* — Fernando L Toledo
(74) *Attorney, Agent, or Firm* — MH2 Technology Law Group LLP

(57) ABSTRACT

An integrated circuit device comprising a diode and a method of making an integrated circuit device comprising a diode are provided. The diode can comprise an island of a first conductivity type, a first region of a second conductivity type formed in the island, and a cathode diffusion contact region doped to the second conductivity type disposed in the first region. The diode can also comprise a cathode contact electrically contacting the cathode diffusion contact region, an anode disposed in the island, an anode contact electrically contacting the anode, and a first extension region doped to the first conductivity type disposed at a surface junction between the first region and the island.

20 Claims, 5 Drawing Sheets

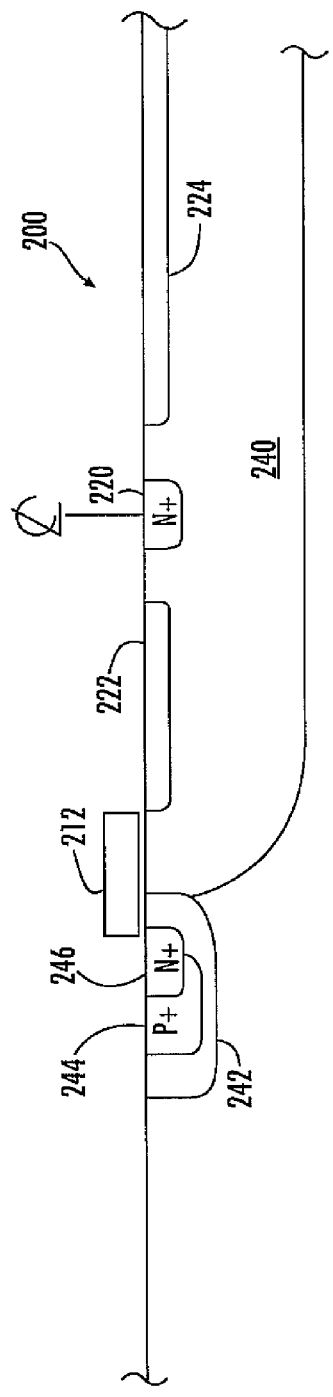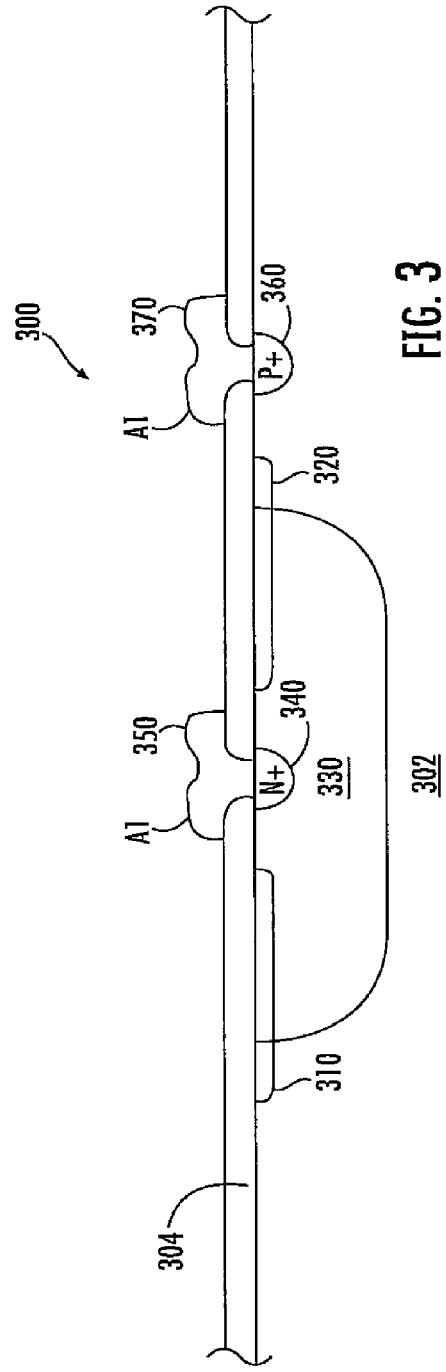

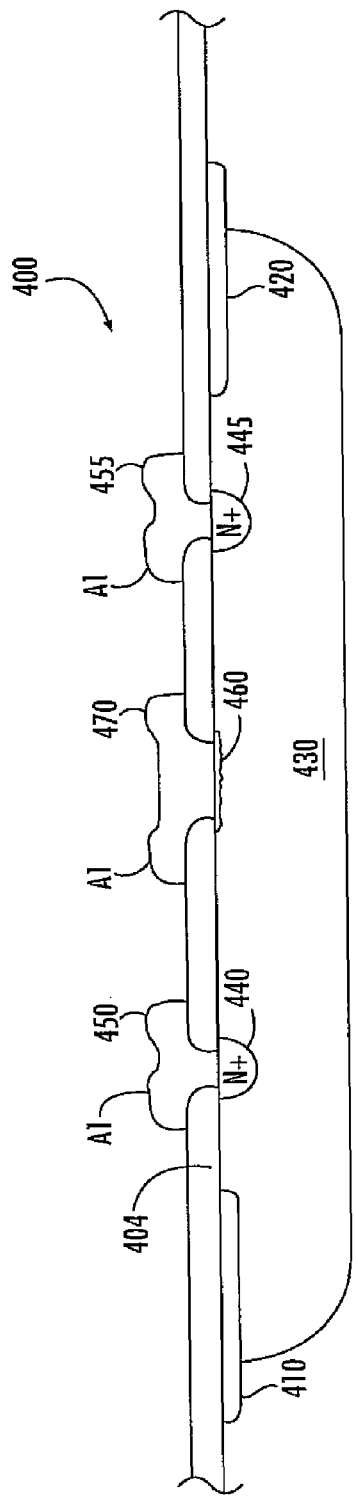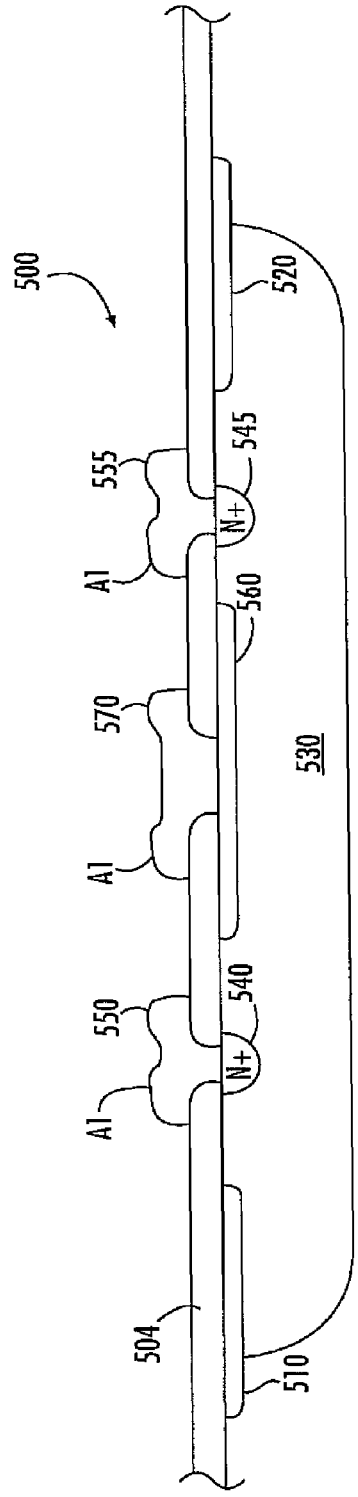

DEPLETABLE CATHODE LOW CHARGE STORAGE DIODE

CROSS-REFERENCE TO RELATED APPLICATIONS

This is a continuation of U.S. patent application Ser. No. 12/115,760 filed on May 6, 2008, now U.S Pat. No. 7,759,728 now allowed, which is a continuation of U.S. patent application Ser. No. 11/326,393 filed on Jan. 6, 2006, and issued Jun. 10, 2008 as U.S. Pat. No. 7,385,246, which claims priority to U.S. Provisional Patent Application Ser. No. 60/701,485 filed on Jul. 22, 2005, the disclosures of which are incorporated herein by reference in their entirety.

FIELD OF THE INVENTION

The subject matter of this application relates to transistors. More particularly, the subject matter of this application relates to the design and structure of a depletable cathode low charge storage diode.

BACKGROUND OF THE INVENTION

Some circuit applications use NDMOS devices for level shifting and/or output switches. Typically, these circuit applications require high voltage, low charge storage diodes. An example of such a circuit application is a half bridge driver 100 having a diode 110, as shown in FIG. 1. Conventional diode 110 used in the half bridge driver 100 is a Schottky diode with a quasi-vertical structure. The quasi-vertical Schottky diode includes a silicide anode, an N− island cathode with an N+ buried layer, and an N+ sinker. As a result of its structure, the quasi-vertical Schottky diode requires a different epi thickness and resistivity for differing voltages to maintain near optimum specific on resistance.

Moreover, conventional diodes made with a N epi layer as a cathode, an N+ buried layer, and an N+ sinker are not compatible with current process flows useful to make lateral drain extension NDMOS structures.

SUMMARY OF THE INVENTION

In accordance with an embodiment of the invention, there is an integrated circuit comprising a Schottky and/or low charge injection, such as, for example, defined by, low net charge (Qnet) and low peak concentration, anode formed in or on a depletable drain extension diode with a high breakdown voltage.

According to various embodiments, there is an integrated circuit device comprising an anode and a drain extension, wherein the anode is formed at least on a portion of the drain extension. The integrated circuit device also comprises an anode to drain extension junction, wherein total depletion of the drain extension occurs under the anode before the anode to drain extension junction reaches breakdown.

In accordance with an embodiment of the invention, there is a method of making an integrated circuit device, the method comprising forming an anode forming a drain extension, wherein the anode is formed at least on a portion of the drain extension wherein the anode and drain extension form an anode to drain extension junction, and wherein total depletion of the drain extension occurs under the anode before the anode to drain extension junction reaches breakdown.

According to various embodiments, total depletion of the N drain extension under the anode contact before anode to N extension junction breakdown can be achieved by use of punch through from the anode through the drain extension to an island thereunder. Alternatively, total depletion of the N drain extension under the anode contact before anode to N extension junction breakdown can be achieved by use of a biased isolated island under the drain extension.

An integrated circuit device comprising a diode and a method of making an integrated circuit device comprising a diode are provided. The diode can comprise an island of a first conductivity type, a first region of a second conductivity type formed in the island, and a cathode diffusion contact region doped to the second conductivity type disposed in the first region. The diode can also comprise a cathode contact electrically contacting the cathode diffusion contact region, an anode disposed in the island, an anode contact electrically contacting the anode, and a first extension region doped to the first conductivity type disposed at a surface junction between the first region and the island.

According to another embodiment there is an integrated circuit. The integrated circuit can comprise a diode, where the diode comprises anode layers and cathode layers where at least one of the anode layers or cathode layers disposed adjacent a semiconductor region. The semiconductor region can be doped to a conductivity type opposite to that of the at last one of the anode layers or cathode layers thereby forming a PN junction between the at least one of the anode layers or cathode layers and the semiconductor region. The integrated circuit can also comprise a circuit configured to sense current flowing through the diode. The circuit can further be configured to cause the semiconductor region to be unbiased when current flow through the diode is sensed and to cause the semiconductor region to be connected to a circuit node that reverse biases the PN junction when current flow through the diode is not sensed.

According to another embodiment there is another integrated circuit device comprising a diode and a method of making an integrated circuit device comprising a diode. The integrated circuit device can comprise an island of a first conductivity type, a first region of a second conductivity type formed in the island, and a second region of the second conductivity type formed in the island, wherein an end portion of the first region overlaps an end portion of the second region to form an overlapping region. The diode can also comprise a first cathode diffusion contact region doped to the second conductivity type disposed in the first region, a first cathode contact electrically contacting the first cathode diffusion contact region, a second cathode diffusion contact region doped to the second conductivity type disposed in the second region, and a second cathode contact electrically contacting the second cathode diffusion contact region. The diode can further comprise an anode diffusion contact region formed in the overlapping region, an anode contact electrically contacting the anode diffusion contact region, a first extension region doped to the first conductivity type disposed at a surface junction between the first region and the island, and a second extension region doped to the first conductivity type disposed at a surface junction between the second region and the island.

According to another embodiment there is a method of making an integrated circuit device comprising a diode. The method can comprise providing an island of a first conductivity type, forming a first region of a second conductivity type in the island, forming a cathode diffusion contact region doped to the second conductivity type in the first region, and forming a cathode contact electrically contacting the cathode diffusion contact region. The method can also comprise forming an anode in the island, forming an anode contact electrically contacting the anode, and forming a first extension region doped to the first conductivity type at a surface junction between the first region and the island.

According to another embodiment there is a half bridge circuit, the circuit comprising a diode having an anode and a cathode, wherein the anode comprises an island of conductive material and the cathode is coupled to the island. The half bridge circuit also comprises a first transistor coupled across the diode and configured to indicate current passing through the diode and a comparator coupled to the first transistor and configured to disconnect the island when the current passing through the diode exceeds a threshold.

It can be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 2 is a schematic diagram of an NDMOS structure of an integrated circuit device having a dual drain extension region according to various embodiments of the present invention;

FIG. 3 is a schematic diagram of a PN junction diode structure of an integrated circuit having a dual drain extension region according to various embodiments of the present invention.

FIG. 4 is a schematic diagram of a Schottky diode structure of an integrated circuit device made using the same dual drain extension regions used to make an NDMOS according to various embodiments of the present invention;

FIG. 5 is a schematic diagram of a PN junction diode structure of an integrated circuit device made using the same dual drain extension regions used to make an NDMOS according to various embodiments of the present invention;

DESCRIPTION OF THE EMBODIMENTS

Figure 1:
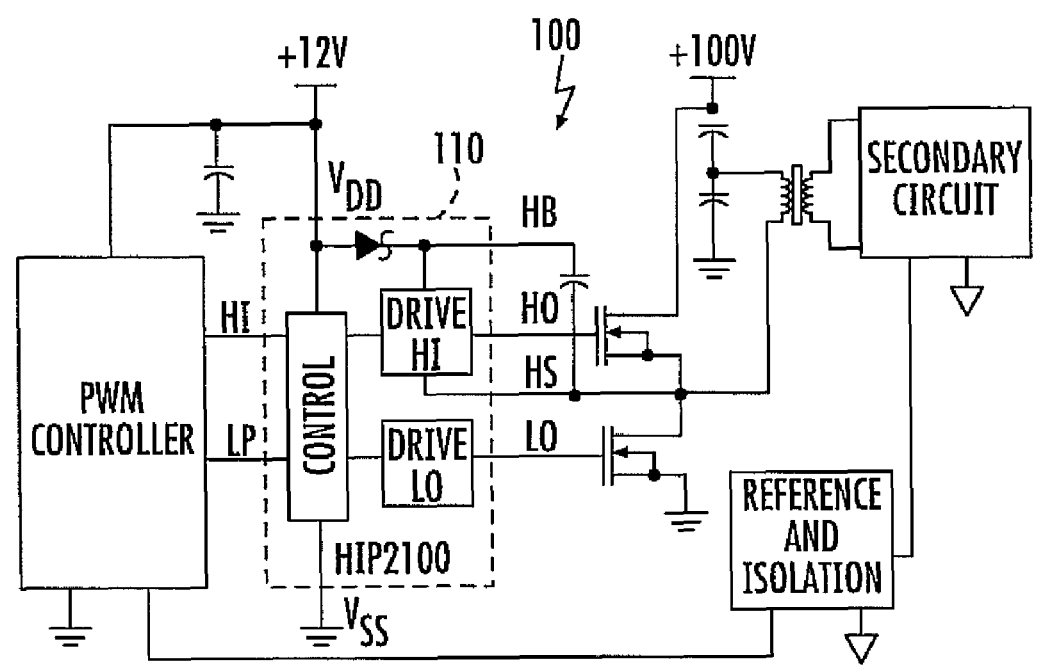
FIG. 1 is a schematic diagram of a conventional half bridge driver.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 2 depicts an exemplary method and device for use in forming dual depletable drain extension NDMOS device. FIGS. 3-6 depict diodes made with dual depletable layers. U.S. Pat. Nos. 4,823,173 and 5,264,719 to Beasom, which are incorporated herein in their entirety, describe structures having dual depletable drain extensions.

FIG. 2 depicts a dual depletable drain extension NDMOS structure 200. The structure 200 comprises a P-type island 202, a gate 212, an N+ drain contact 220, a first P-type extension 222, a second P-type extension 224, an N-type drain extension 240, a P-type body 242, a P+ body contact 244, and an N+ source 246. The structure 200 is formed in the P-type island 202. Moreover, the N+ drain contact 220 and the P-type extensions 222 and 224 are formed in the N-type drain extension 240. Further, the P+ body contact 244 and N+ source 246 are formed in the P-type body 242. The gate 212 is formed generally above the N-type extension 240 and P-type body 242.

Because the structure 200 is built in the P-type island 202, however, it may be difficult to form an appropriate Schottky diode in the same process without adding additional process steps.

The structure 200 also can be optimized for a range of different voltages by adjusting the length of the extensions to provide the desired breakdown voltage without changing any process steps. The structure can enable the use of the improved features of the lateral NDMOS in integrated circuits that also require high voltage low charge storage diodes without adding any process steps to implement the diode.

According to various embodiments, a high voltage diode can be made using layers that are also used to make a dual depletable drain extension NDMOS without adding additional process steps. Such a high voltage diode is shown, for example, in FIG. 3. The diode 300 can comprise a P-type island 302, an oxide layer 304, a first P-type extension 310, a second P-type extension 320, an N-type extension 330, an N+ cathode diffusion contact region 340, a cathode contact 350, a P+ anode diffusion contact region 360, and an anode contact 370.

The diode 300 is formed in the P-type island 302. According to various embodiments, the P-type island can an epitaxial layer or the device layer of a bonded wafer. The island can have a surface doping concentration of about 5E13 to 2E14 ions/cm$^3$ and an integrated doping greater than 2E12 ions/cm$^2$. The island can have a thickness of about 30 microns. A description of various suitable islands is shown in U.S. Pat. No. 6,946,364, which is incorporated herein in its entirety. Moreover, the first and second P-type extensions 310 and 320, respectively, are formed in portions of the N-type extension 330. The N-type extension 330 can have an integrated dose of about 2E12 ions/cm$^2$. It can also have a junction depth ranging from about 0.5 μm to 10 μm. The P-type extensions 310 and 320 can have an integrated dose of about 1E12 ions/cm$^2$. Further, they can have a junction depth ranging from 0.1 μm to 5 μm. The length of the portion of the P-type extensions 310 and 320 that overlap the N-type extension 330 adjacent the surface intersection of the junction between the N-type extension 330 and the P island 302 can be about the desired breakdown voltage in V/15V i.e., in certain embodiments it can support about 15V per micron of length. The space between the N+ cathode contact 340 and the P-type extensions 310 and/or 320 can be about 3 μm to 10 μm. The P+ anode contact 360 can be about 4 μm to 10 μm outside the N-type extension 330. The P-type extensions 310 and/or 320 can optionally overlap the P+ anode contact 360. The two P-type extension regions, 310 and 320, can be connected at the ends to thereby form a ring surrounding the N+ cathode diffusion contact region 340. The connected P extension can overlie the entire surface intersection of the junction between the N-type extension 330 and the P-type island 302. The connected P-type extension acts as a junction termination extension layer to increase the breakdown of the N extension to P island junction. The N-type extension 330 can serve as a cathode. The N+ region 340 can be formed in a portion of the N-type extension 330 and can be electrically contacted by the cathode contact 350, which can be a metal, such as, for example, aluminum. Further, the P+ anode diffusion contact region 360 is electrically contacted by the anode contact 370, which can also be a metal, such as, for example, aluminum.

The diode 300 can create a high voltage diode with significant charge storage. The turn off delay for the diode 300 can be at least 5 microseconds. While not intending to be limited to any particular theory, it is believed that significant charge storage is due to injection of electrons from the cathode, including the cathode contact, into the lightly doped P-type island when the diode is forward biased.

Various layers of the diode 300 can be made using the same process steps that are used to make the comparable layers of the structure 200. For example, N-type extension 330 can be made with the same steps used to make N-type extension, such as extension 240. Further, P-type extensions 310 and 320 can be made using the same steps used to make P-type extensions, such as extensions 222 and 224. As discussed above, P-type extensions 310 and 320 can be parts of a single extension region that surrounds the N+ region 340. P+ anode diffusion contact region 360 can be made using the same steps used to form a P+ body contact, such as body contact 244. P-type island 302 can be formed using the same steps used to form a P-type island, such as P-type island 202. Contacts 350 and 370 can be formed using the same steps used to form metal contacts (not shown) to the terminal regions, such as in structure 200.

FIG. 4 shows a Schottky diode 400 having a low charge storage can be made using an N-type extension layer as a cathode. The Schottky diode 400 can be made using layers that are also used to make a dual depletable drain extension NDMOS structure, such as structure 200, without adding additional process steps.

The Schottky diode 400 can comprise a P-type island 402, an oxide layer 404, a first P-type extension 410, a second P-type extension 420, an N-type extension 430, a first N+ cathode diffusion contact region 440, a second N+ cathode diffusion contact region 445, a first cathode contact 450, a second cathode contact 455, an anode 460, and an anode contact 470. The Schottky diode 400 can be formed in the P-type island 402. Moreover, the first and second P-type extensions, 410 and 420, respectively, can be formed in portions of the of the N-type extension 430. P-type extensions 410 and 420 can be connected forming a ring lying over, for example, the entire surface intersection of the N-type extension 430 and the P-type island junction 402. The geometry of the various structures in the example shown in FIG. 4 can be similar to those described above for the example shown in FIG. 3.

According to various embodiments, the anode to N+ cathode contact space in the diode 400 can be set at 10 to 15 V per μm of space. For the version having a P-type extension ring that terminates the outer edge of the silicide anode, the length of the P-type extension ring can be set for about 15V per μm of length and its space to the N+ cathode contact can be similar to the space from the N+ cathode contact to the other P-type extension layers.

The N-type extension 430 can serve as a cathode. The first and second N+ cathode diffusion contact regions 440 and 445, respectively, can also be formed in the N-type extension 430. The N+ cathode diffusion contact regions 440 and 445 can optionally connect forming a single ring shaped region that encloses the anode 460. The first N+ cathode diffusion contact region 440 can also be formed in a portion of the N-type extension 430 and can be electrically contacted by the first cathode contact 450, which can be a metal, such as, for example, aluminum. Similarly, the second N+ cathode diffusion contact region 445 can also be formed in a portion of the N-type extension 430 and can be electrically contacted by the second cathode contact 450, which can be a metal, such as, for example, aluminum. The anode 460 can be formed in a portion of the N-type extension 430 and can be disposed between the first N+ cathode diffusion contact region 440 and the second N+ cathode diffusion contact region 445. Moreover, the anode 460 can comprise a silicide, such as, for example, PtSi. Further, the anode 460 can be electrically contacted by the anode contact 470, which can be a metal, such as, for example, aluminum.

According to various embodiments, the Schottky diode 400 shown in FIG. 4 uses the N-type extension layer 430 as the cathode. Moreover, the first and second N+ cathode diffusion contact regions 440 and 445, respectively, can provide lower series resistance to the N-type extension layer 430. The Schottky diode 400 can also provide low charge storage. The low charge storage results in a diode reverse recovery time that can be less than 100 ns. While not intending to be limited to any particular theory, it is believed that the charge storage is reduced due to the majority carrier conduction characteristics of the Schottky diode structure.

A low doped P-type extension (not shown) can also be used as a guard ring around the perimeter of the Schottky anode 460 in the Schottky diode structure 400 of FIG. 4. The P-type extension can relieve electric field crowding during reverse bias and can improve breakdown performance. Still further, a low doped P-type guard ring can also limit charge injection from the guard ring and storage of injected charge in the cathode during forward bias in the Schottky diode structure 400.

The layers of the diode 400 can be made using the same process steps used to make the comparable layers of NDMOS structure 200 as described above. The PtSi layer that can be used to form the Schottky diode 400 can also be formed in contact areas to the silicon surface of the diode and the NDMOS 200 (not shown) to reduce contact resistance between the metal contact and doped silicon surface.

According to various embodiments, the breakdown of a diode made using an N-type extension as a cathode and a silicide as an anode, such as that shown in FIG. 4, may occur at the interface plane of the silicide to N-type extension junction. This can be the case even where edge breakdown limits are eliminated. For example, an N-type extension having a surface doping of about 1E16 can have a breakdown of about 50 V. This breakdown value may be less than is needed for a half bridge driver application.

FIG. 5 shows another low charge storage diode 500 that can be made using an N-type extension layer as a cathode and a lightly doped P region as an anode. The low charge structure diode 500 can be made using layers that are also used to make a dual depletable drain extension NDMOS structure, such as structure 200, without adding additional process steps.

The low charge storage diode 500 is formed in a P-type island 502. The low charge storage diode 500 also can comprise an oxide layer 504, a first P-type extension 510, a second P-type extension 520, an N-type extension 530 (which can serve as a cathode), a first N+ cathode diffusion contact region 540 connected to a first cathode contact 550, and a second N+ cathode diffusion contact region 545 connected to a second cathode contact 555. The low charge storage diode 500 also comprises a P-type anode diffusion contact region 560 (also called a third P-type extension) that can be used as an anode. The P-type anode diffusion contact region 560 can be electrically connected to an anode contact 570. According to various embodiments, the first and second cathode contacts 550 and 555, respectively, and the anode contact 570 can be made of a metal, such as, for example, aluminum. The P-type extensions, 510 and 520, can be joined to form a ring shape that lies over, for example, the entire surface intersection of the N-type extension to the P-type island junction.

According to various embodiments, the P-type anode diffusion contact region 560 can be disposed between the first and second N+ cathode diffusion contact regions 540 and 545, respectively. Moreover, the third P-type extension 560 can be lightly doped. For example, the P-type extension 560 can have a low integrated dose, such as, for example, less than about 2E12 and in some cases from about 5E11 ions/cm$^2$ to about 2E12 ions/cm$^2$, and a low peak concentration, such as, for example, less than about 5E17 ions/cm$^3$. The lightly doped P-type extension 560 can form a layer that can inject a minimum number of carriers during forward bias. Thus, the third P-type extension 560 meets the requirement for low charge storage. The third P-type extension 560 layer doping can be much less than the maximum doping in the cathode. The maximum doping in the cathode can usually be found in the cathode contact. The integrated doping of the P-type extensions can also be much less than the integrated doping of the cathode. The peak doping and integrated dose of the cathode contact can be 1E20 ions/cm$^3$ and 5E15 ions/cm$^2$ respectively.

As discussed, the diodes 400 and 500 can be used as low charge storage diodes. According to various embodiments, the breakdown voltage of a diode can be increased if the region of an N-type extension beneath the anode totally depletes at a reverse bias that is lower than the junction breakdown voltage. In some cases, the total depletion requirement can be met by reducing the doping at least in the region under the anode to a level that does deplete during reverse bias before breakdown occurs. This can be accomplished, for example, by patterning the N-type extension cathode mask so that the doping is introduced, such as by ion implantation, into only a portion of the N-type extension. The dopant can then be diffused until the masked regions expand laterally to overlap, thereby forming a region of lower net doping. As an illustrative example, at the mask edge, the integrated doping will be about half of that where the entire area is open to the implant, assuming no significant contribution from diffusion from the opposite side of the masked area.

Figure 6:
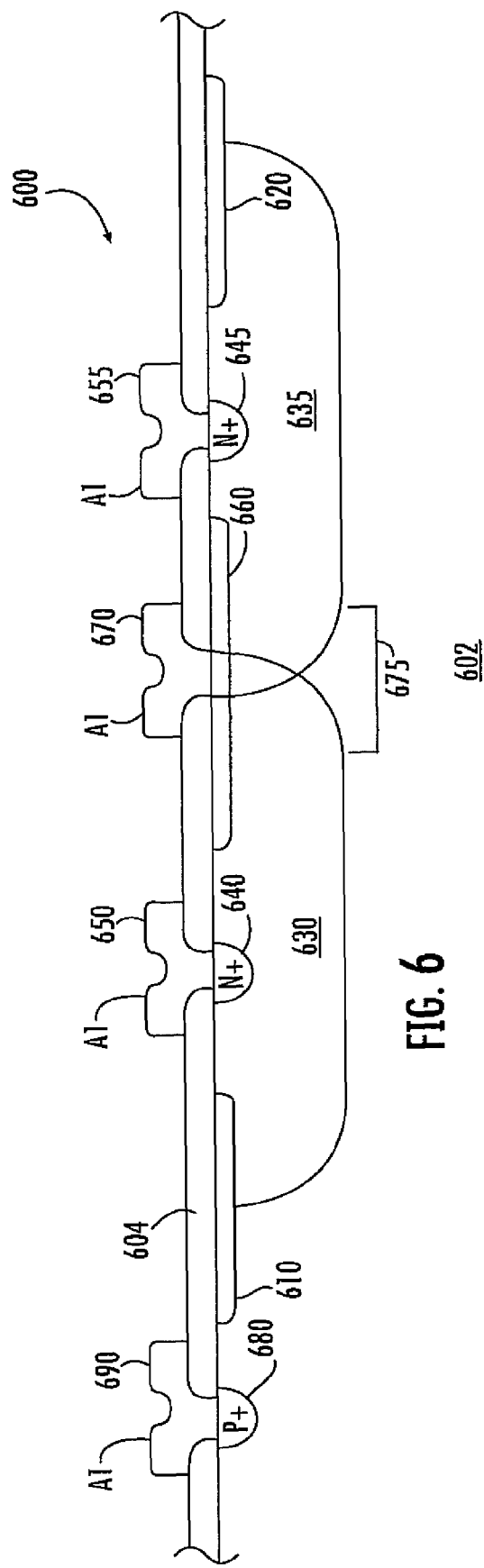
FIG. 6 is a schematic diagram of a diode structure of an integrated circuit device having a dual drain extension region according to various embodiments of the present invention.

An example of a diode that uses a patterned N-type extension as a cathode under the anode to reduce cathode depletion voltage is shown in FIG. 6. In FIG. 6, there is shown a high voltage low charge storage diode 600 comprising a P-type island 602, and oxide layer 604, a first P-type extension 610, a second P-type extension 620, a third P-type extension 660 (which can serve as an anode), a first N-type extension 630 a second N-type extension 635 (which together can serve as a cathode), a first N+ cathode diffusion contact region 640, a second N+ cathode diffusion contact region 645, a first cathode contact 650, a second cathode contact 655, and an anode contact 670. An end portion of the first N-type extension 630 can overlap an end portion of the second N-type extension 635 forming an overlapping region at an area 675. The structure 600 can also include an optional P+ island contact region 680 and an optional island contact metallization 690. The geometry of the various structures in the example shown in FIG. 6 can be similar to those described above. According to various embodiments, the gap between the two N-type extension edges can be ~0.5 to 1.5 times its junction depth when it is formed from a diffused layer. According to various embodiments, the width of the anode contact aperture through the oxide layer 604 can be less than the length of the gap. Moreover, a silicide can be formed in the aperture through the oxide so as to contact the P-type extension region 660. According to various embodiments, the silicide can comprise platinum, cobalt, or titanium.

According to various embodiments, the area 675 in the high voltage low charge storage diode 600 under the first N-type region 630 and the second N-type region 635 overlap can have a reduced doping. The region of reduced doping 675 can increase the breakdown voltage of the high voltage low charge storage diode 600. Moreover, the P+ island contact 690 can be used to apply a bias voltage to P-type island 602 and thereby apply bias to the junction between the P-type island and the merged N-type extension regions 630 and 635. The high voltage low charge storage diode 600 is formed in a P-type island 602. Moreover, the first P-type extension 610 and the first N+ cathode diffusion contact region 640 are formed in portions of the first N-type extension and the second P-type extension and the second N+ cathode diffusion contact region 645 are formed in portions of the second N-type extension. P-type extensions 610 and 620 can be connected to form a ring shaped region that lies over, for example, the entire surface intersection of the junction between the N-type extension and the P-type island. The N-type extensions 630 and 635 can also optionally be a single ring shaped structure. The third P-type extension 660, which can be used as the anode, can electrically connect to the anode contact 670, which can be made of a metal, such as aluminum. The anode contact 670 can be formed in a region 675 where the first N-type extension 630 intersects with the second N-type extension 635. Still further, the first cathode contact 650, which can be a metal, such as, for example, aluminum, can electrically contact the first N+ cathode diffusion contact region 640 and the second cathode contact 655, which can be a metal, such as, for example, aluminum, can electrically contact the second N+ cathode diffusion contact region 645.

The region 675 below the anode contact, where the N-type extensions 630 and 635 intersect, can be doped by patterning using a mask that is used to make the N-type extensions 630 and 635. The result can be a region 675 formed by overlapping diffusion fronts that extend in from the two edges of the implant blocking mask. The overlapping diffusion fronts can form the portion of the cathode in which the anode, or at least the portion of the anode, that can be contacted by the anode contact is formed. Patterning the region 675 below the anode contact 670 using the same mask as is used to form the N-type extensions 630 and 635 can allow the doping to be introduced into only a fraction of the area beneath the anode contact 670. The dopant can then be diffused until the masked regions expand laterally to overlap, forming a region of lower net doping.

According to various embodiments breakdown can be increased if the region 675 beneath the anode contact totally depletes at a reverse bias lower than the junction breakdown voltage. By patterning the N-type extension cathode mask and reducing the doping in the region 675 under the anode contact, total depletion can be reached during reverse bias before breakdown occurs.

The structure shown in FIG. 6 can also be designed such that the depletion layer that extends down from the anode can punch through the cathode and contact the underlying floating P-type island 602 at a selected cathode to anode voltage. After punch through occurs, the voltage between the P-type island and the cathode follows the voltage between the cathode and the anode. That is, $$V_s = V_a - V_{pt} \quad [1]$$

for $V_a < V_{pt}$, where the cathode is grounded, $V_{pt}$=punch through voltage (negative), $V_s$=substrate voltage (negative) and $V_a$=anode voltage (negative). Punch through can provide bias to the P-type island 602. The bias on the P-type island 602 can help to deplete portions of the N-type extension away from the overlap region 675 where integrated doping can be the highest.

For example, in instances where the P-type extension 660 cannot totally deplete the area 675 due to the higher integrated N-type extension dose, punch through biasing of the P-type island 602 can allow the area 675 to be totally depleted. Punch through biasing can also allow area 675 to totally deplete before breakdown occurs between the anode and the N-type extensions 630 and 635. A high N-type extension integrated dose can reduce the cathode series resistance. For example, the dose can be about 2E12 ions/cm².

The diode 600 also can be optimized for a range of different voltages by adjusting the length of the extensions to provide the desired breakdown voltage. For example, the breakdown can bee adjusted by adjusting the length of the overlap of P-type extension on N-type extension. The overlap of P-type extension 610 on N-type extension 630, the overlap of P-type extension 620 on N-type extension 635, and the overlap of P-type extension 660 beyond the aperture through the oxide for anode contact 670 on N-type extension 630 and 635 can all be adjusted. According to various embodiments, the overlap can support about 15V of breakdown voltage per μm of overlap as discussed above. This can also be done without changing any process steps.

According to various embodiments diode 600 can also include an inversion stop (not shown) that surrounds the anode to separate it from the floating P-type island 602. The stop can be composed of a ring of N+ cathode contact diffusion. The inversion stop prevents the possible formation of a parasitic PMOS across the surface of the N-type extension between P-type extension 660 and P-type extension 620 by increasing the field threshold voltage above the maximum possible parasitic turn on voltage.

The island contact 690 of the diode 600 contacts the P+ island diffusion contact region 680 and can provide a reverse bias on the P-type island 602 to deplete the N-type extensions 630 and 635 from the bottom while the P-type extensions 620 and 610 deplete the N-type extensions from the top, as in the NDMOS drain extension. Therefore the integrated doping of this part of the cathode can be twice as high as the part under the anode while still totally depleting before breakdown. The higher integrated doping can reduce the cathode series resistance. The length of the totally depleted region can be increased to raise breakdown.

The island contacts of the diodes shown in FIGS. 5 and 6 can be tied to a circuit node such that the P-type islands 502 and 602 can prevent forward biasing to the cathode. The connection can also allow depletion of the region below the anode from both sides during reverse bias. This can maximize the integrated cathode dose and achieve minimum series resistance. Charge storage during diode forward bias can also be avoided because current can be prevented from flowing across the junction between island and cathode. This connection can also eliminate the floating island. Capacitive coupling from isolation to the floating P-type island can cause the island to cathode junction to forward bias during, for example, negative dV/dt on the cathode. This can lead to the transient injection of holes from the island into the cathode.

According to various embodiments, the diode 600 can be based on a modification of the diode 500. Similar modifications can be made to diode 400 with the region of reduced doping under the Schottky anode layer 460 to thereby improve its results.

Figure 7A:
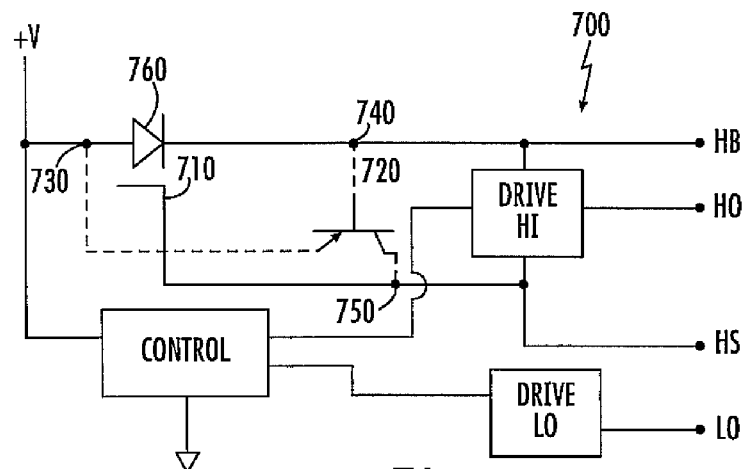
FIG. 7A is a schematic diagram of a half bridge driver application according to various embodiments of the present invention.

Referring to FIG. 7A, there is depicted an exemplary configuration 700 of various connections that can be used in a device where the half bridge application uses a diode. In FIG. 7A, the island is shown connected to an HS pin 710.

In some cases, a parasitic low HFE PNP 720 can occur in the configuration 700 of FIG. 7A. The parasitic PNP 720 can be modeled as a PNP transistor having its emitter 730 connected to the anode of diode 760, its base 740 connected to the cathode of diode 760, and its collector 750 connected to the island. In some cases, when diode 760 is conducting current, some of the current may be shunted through the PNP 720 and may degrade the performance of configuration 700.

Parasitic losses by PNP 720 can be eliminated by using a circuit that senses the presence of an emitter base junction current in the parasitic PNP 720. In response, the circuit may then isolate the collector of the PNP 720 and allow it to float when the diode 760 is conducting current. One example of such a circuit will now be described with reference to FIG. 7B.

Figure 7B:
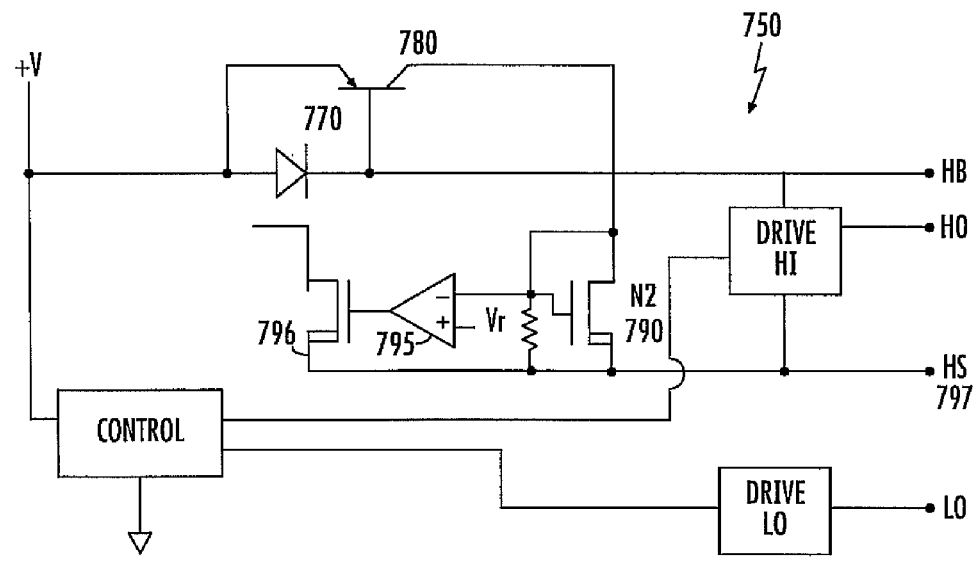
FIG. 7B is a schematic diagram of a half bridge driver application according to various embodiments of the present invention.

FIG. 7B depicts an example of a circuit 750 that can detect the current through the diode 770 and reduce the parasitic losses, such as those modeled by PNP 720. A PNP 780 may be coupled across diode 770 to sense the current passing through diode 770. The collector of PNP 780 is then coupled to NMOS 790. When current flows from the collector of PNP 780, the gate voltage of NMOS 790 rises. The resulting rise in the gate voltage of NMOS 790 is subsequently sensed by a comparator 795. Comparator 795 may be configured to switch to a low output state when $V_{gate}$ is greater than $V_r$. In some embodiments, $V_r$ can be a reference voltage designed to match the turn on voltage of NMOS 790. When in its low output state, comparator 795 turns off NMOS switch 796, which disconnects the island and allows the island to float. When current through diode 770 drops, the sense current passed by PNP 780 collector drops. As shown in FIG. 7B, a resistor may then pull the gate voltage of NMOS 790 down below $V_r$. When $V_{gate}$ is less than $V_r$, comparator 795 output switches to its high output state, which turns NMOS switch 796 on and connects the island to circuit node HS 797.

While the invention has been described using particular dopings, such as N-type or P-type, it is envisioned that complementary devices with opposite dopings are also contemplated.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit device comprising a diode, the diode comprising:
    an island of a first conductivity type;
    a first region of a second conductivity type formed in the island;
    a diffusion contact region of the second conductivity type disposed in the first region;
    a first conductive contact electrically contacting the diffusion contact region;
    a first extension region of the first conductivity type disposed in the first region;
    a second conductive contact electrically contacting the first extension region; and
    a second extension region of the first conductivity type disposed at a surface junction between the first region and the island.

2. The integrated circuit device according to claim 1, wherein the first extension region comprises an integrated dopant dose of between about 5E11 ions/cm$^2$ and about 2E12 ions/cm$^2$.

3. The integrated circuit device according to claim 1, wherein the second extension region is disposed along the entire surface junction between the first region and the island.

4. The integrated circuit device according to claim 1 further comprising:
    a third extension region doped to the first conductivity type disposed at the surface junction between the first region and the island.

5. The integrated circuit device according to claim 4, wherein the first extension region and the second extension region are connected to form a ring surrounding the diffusion contact region.

6. The integrated circuit device according to claim 4 wherein the diffusion contact region is a first diffusion contact region and the integrated circuit device further comprises:
    a second diffusion contact region doped to the second conductivity type disposed in the first region; and
    a third conductive contact electrically contacting the second diffusion contact region.

7. The integrated circuit device according to claim 6, wherein the first extension region is disposed between the first diffusion contact region and the second diffusion contact region.

8. The integrated circuit device according to claim 7, wherein the first extension region comprises an integrated dopant dose of less than about 2E12 ions/cm$^2$.

9. The integrated circuit device according to claim 7, wherein the first extension region comprises an integrated dopant dose of between about 5E11 ions/cm$^2$ and about 2E12 ions/cm$^2$.

10. An integrated circuit device comprising a diode, the diode comprising:
    an island of a first conductivity type;
    a first region of a second conductivity type formed in the island;
    a second region of the second conductivity type formed in the island, wherein an end portion of the first region overlaps an end portion of the second region to form an overlapping region;
    a first conductive contact electrically contacting the first region;
    a first extension region of the first conductivity type disposed at a surface junction between the first region and the island;
    a second extension region of the first conductivity type disposed at a surface junction between the second region and the island; and
    a third extension region of the first conductivity type disposed at a surface of the overlapping region.

11. The integrated circuit device according to claim 10 further comprising:
    a first diffusion contact region of the second conductivity type disposed in the first region and electrically contacting the first conductive contact.

12. The integrated circuit device according to claim 11 further comprising:
    a third conductive contact electrically contacting a second diffusion contact region of the second conductivity type formed in the second region.

13. The integrated circuit device according to claim 10, wherein the first extension region and the second extension region are connected to form a ring surrounding the overlapping region.

14. The integrated circuit device according to claim 10 further comprising:
    a silicide disposed in a portion of the overlapping region.

15. The integrated circuit device according to claim 10 further comprising:
    an oxide formed over the island; and
    an aperture formed in the oxide and exposing a portion of the overlapping region.

16. The integrated circuit device according to claim 10, wherein the overlapping region totally depletes under reverse bias before the diode reaches breakdown.

17. A method of making a diode, comprising:
    providing an island having a first conductivity type within a semiconductor substrate;
        within the island, doping a first region to a second conductivity type;
        doping a diffusion contact region to the second conductivity type within the first region;
        forming a first conductive contact to electrically contact the diffusion contact region;
        doping a first extension region to the first conductivity type within the first region;
        forming a second conductive contact to electrical contact the first extension region; and
        doping a second extension region to the first conductivity type at a surface junction between the first region and the island.

18. The method of claim 17, further comprising doping the first extension region to integrated dopant dose of between about 5E11 ions/cm$^2$ and about 2E12 ions/cm$^2$.

19. The method of claim 17, further comprising disposing the second extension region along the entire surface junction between the first region and the island.

20. The method of claim 17, further comprising doping a third extension region to the first conductivity type disposed at the surface junction between the first region and the island.

* * * * *